(12) United States Patent
Takahashi et al.

(10) Patent No.: US 6,545,515 B2
(45) Date of Patent: Apr. 8, 2003

(54) SEMICONDUCTOR SWITCH HAVING A VOLTAGE DETECTION FUNCTION

(75) Inventors: Satoru Takahashi, Shiga (JP); Seiki Yamaguchi, Shiga (JP); Kouji Takada, Kyoto (JP)

(73) Assignee: Matsushita Electric Industrial Co., Ltd., Kadoma (JP)

( * ) Notice: Subject to any disclaimer, the term of this patent is extended or adjusted under 35 U.S.C. 154(b) by 0 days.

(21) Appl. No.: 09/904,125

(22) Filed: Jul. 12, 2001

(65) Prior Publication Data

US 2002/0011874 A1 Jan. 31, 2002

(30) Foreign Application Priority Data

Jul. 28, 2000 (JP) ........................................ 2000-228491

(51) Int. Cl.[7] .............................. H03B 1/00; H03K 3/00
(52) U.S. Cl. ...................... 327/110; 327/427; 327/432; 327/434
(58) Field of Search ................................. 327/110, 427, 327/431, 432, 434, 435, 436, 437; 315/224; 326/82, 83, 89

(56) References Cited

U.S. PATENT DOCUMENTS

| | | | | |
|---|---|---|---|---|
| 4,893,158 A | * | 1/1990 | Mihara et al. | 327/427 |
| 5,079,456 A | * | 1/1992 | Kotowski et al. | 327/427 |
| 5,422,593 A | * | 6/1995 | Fujihira | 327/427 |
| 5,432,471 A | * | 7/1995 | Majimdar et al. | 327/427 |
| 5,767,545 A | * | 6/1998 | Takahashi | 327/427 |
| 5,903,422 A | * | 5/1999 | Hosokawa | 327/427 |

* cited by examiner

*Primary Examiner*—Tuan T. Lam
(74) *Attorney, Agent, or Firm*—Merchant & Gould P.C.

(57) ABSTRACT

In a semiconductor switch, a voltage detection circuit is provided so as to be in parallel with a first switching element for turning on/off a power supply to a load, in which a voltage detection portion for detecting a drain voltage of the first switching element by dividing a voltage upon a resistance ratio or the like and a second switching element are connected in series to each other. The second switching element is turned on/off in accordance with ON/OFF of the first switching element. Accordingly, detection of a drain voltage is performed normally when the first switching element is in an ON state. When the first switching element is in an OFF state, a leakage current can be reduced by the second switching element.

14 Claims, 9 Drawing Sheets

SEMICONDUCTOR SWITCH HAVING A VOLTAGE DETECTION FUNCTION

BACKGROUND OF THE INVENTION

1. Field of the Invention

The present invention relates to a low side switch for driving a load such as a lamp, a light-emitting diode (LED), and an inductor. In particular, the present invention relates to a semiconductor switch capable of reducing a leakage current during an OFF time.

2. Description of the Related Art

Conventionally, as a procedure for driving a load such as a lamp and a coil, a method generally is used for driving a load by turning on/off a switch provided on a low potential side of a load as shown in FIG. 7. In FIG. 7, reference numeral 31 denotes a power supply, 32 denotes a load such as a lamp and a coil, and 30 denotes a switch. As the switch 30, a transistor mainly is used. Among transistors, an N-type power MOSFET, which may be used as a low side switch, mostly is used.

Furthermore, the above-mentioned systems generally are provided with various protection functions. In order to realize a load short protection function, an overcurrent protection function, and the like among the protection functions, it is required to detect a voltage on a low potential side of a load (i.e., a potential of a drain terminal in the case of using a MOSFET as a switch). FIG. 8 shows a conventional example in which a MOSFET is used as a switch, and a function of detecting a voltage of a drain terminal is incorporated.

In FIG. 8, reference numeral 31 denotes a power supply, 32 denotes a load such as a lamp and a coil, and 34 denotes an input terminal of a system. Furthermore, reference numeral 21 denotes a MOSFET that functions as a switch for driving the load 32. Reference numeral 25 denotes a drain electrode of the MOSFET 21, and a potential of the drain electrode 25 is assumed to be $V_D$. Furthermore, reference numeral 24 denotes a gate electrode of the MOSFET 21, and the MOSFET 21 is turned on/off based on a potential of the gate electrode 24. Reference numeral 26 denotes a source electrode of the MOSFET 21, which is grounded. Herein, reference numeral 40 denotes a switching portion, and elements contained therein can be formed on the same semiconductor substrate.

In the switching portion 40, a voltage detection circuit 22 is connected in parallel to the MOSFET 21 between the drain electrode 25 and the source electrode 26. The voltage detection circuit 22 can detect the potential $V_D$ of the drain electrode 25 by connecting a resistive element 28 (resistance Ra) and a resistive element 29 (resistance Rb) in series as resistors for detecting a drain voltage. More specifically, the potential $V_D$ of the drain electrode 25 can be detected only by monitoring a potential $V_C$ of an output signal (voltage detection signal) 23 of the voltage detection circuit 22. The relationship between $V_D$ and $V_C$ can be expressed as follows:

$$V_C = Rb/(Ra+Rb) \times V_D \text{ (more specifically, } V_D = V_C \times (Ra+Rb)/Rb)$$

A drain voltage is detected in this manner, and is used for controlling various functions such as a load short protection function and an overcurrent protection function.

Furthermore, reference numeral 27 denotes a control circuit. The control circuit 27 receives the voltage detection signal $V_C$ output from the voltage detection circuit 22 to control the gate electrode 24 of the power MOSFET 21.

However, in the conventional example, even if a leakage current of the power MOSFET 21 is small during an OFF time of the power MOSFET 21, a current flows through the resistive elements 28 and 29 connected between the drain and the source, so that a leakage current flows. In this case, a current of about (power supply voltage)/(total resistance of the load 32 and the resistive elements 28, 29 for detecting a voltage) flows.

When a leakage current is large, a current consumed by the system is increased. Furthermore, in the case where a load is an LED, the LED may emit light even during an OFF time.

In order to minimize a leakage current, a method of increasing a resistance of the resistive elements 28 and 29 for detecting a voltage is considered easily. However, in the case where the voltage detection signal $V_C$ is received by a MOSFET or a transistor, when the resistance of the resistive elements 28 and 29 for detecting a voltage is prescribed to be too large, a current flowing as the voltage detection signal $V_C$ becomes too small, which may cause inconvenience for control. Furthermore, in order to increase a resistance, a tip area also is increased.

SUMMARY OF THE INVENTION

Therefore, with the foregoing in mind, it is an object of the present invention to provide a voltage detection circuit and a semiconductor device in which a leakage current is reduced without increasing a tip area, and various protection functions with respect to a load are ensured.

In order to achieve the above-mentioned object, the voltage detection circuit of the present invention is connected in parallel to a first switching element for controlling a power supply to a load and includes a second switching element and a voltage detedction portion connected in series to each other, wherein the second switching element is connected to a high potential side of the first switching element, and the voltage detection portion detects a voltage of a high potential electrode of the first switching element when the second switching element is conducting.

In the above-mentioned voltage detection circuit, the voltage detection portion is composed of at least two resistive elements, and detects a voltage of the high potential electrode of the first switching element based on a division ratio of the resistance of the resistive elements. In this case, it is preferable that the resistive element is a polysilicon resistor formed on an oxide film of the same substrate as that of the first switching element.

Alternatively, the voltage detection portion is composed of at least two Zener diodes.

Furthermore, the second switching element is composed of an N-channel MOSFET. In this case, it is preferable that a backgate of the N-channel MOSFET is at the same potential as that of a source or at a ground potential. Alternatively, the second switching element is composed of a bipolar transistor or an N-channel MOSFET with a high withstand voltage.

In order to achieve the above-mentioned object, the semiconductor device of the present invention includes: a first switching element for controlling a power supply to a load; the above-mentioned voltage detection circuit; and a control circuit that brings the first switching element into conduction or out of conduction in accordance with a control signal from outside, and brings the first switching element out of conduction based on a voltage detection signal output from the voltage detection circuit.

In the above-mentioned semiconductor device, the second switching element of the voltage detection circuit is brought into conduction or out of conduction in accordance with the control signal from outside.

Furthermore, the first switching element is composed of an N-channel MOSFET, an insulating gate type bipolar transistor, or a bipolar transistor.

Furthermore, it is preferable that the first switching element, the second switching element, and the voltage detection circuit are formed on the same semiconductor substrate.

Furthermore, the first switching element is composed of an N-channel vertical MOSFET with a high withstand voltage, using an N-type silicon substrate as a drain electrode.

Furthermore, the first switching element and the second switching element of the voltage detection circuit are both composed of an N-channel vertical MOSFET with a high withstand voltage, using the same N-type silicon substrate as a drain electrode.

Alternatively, the second switching element of the voltage detection circuit is formed on the same semiconductor substrate as that of the first switching element while being electrically insulated with an insulator from the first switching element.

According to the above-mentioned configuration, a voltage detection circuit is provided so as to be in parallel with a power MOSFET that is a first switching element, in which a voltage detection portion for detecting a drain voltage by dividing a voltage upon a resistance ratio or the like and a second switching element for reducing a leakage current are connected in series. When the power MOSFET is in an OFF state, the second switching element is turned off, and when the power MOSFET is in an ON state, the second switching element is turned on. Consequently, detection of a drain voltage is performed normally when the power MOSFET is in an ON state, and a leakage current can be reduced when the power MOSFET is in an OFF state.

Furthermore, in the voltage detection portion, a plurality of Zener diodes also can be used in addition to voltage division upon a resistance ratio.

Furthermore, a gate electrode of the power MOSFET and a control electrode of the switching element for reducing a leakage current are not connected directly to each other. The control electrode of the switching element for reducing a leakage current directly is supplied with a control signal from outside, and the gate electrode of the power MOSFET is supplied with a control signal via a control circuit that receives a voltage detection signal from the voltage detection circuit. Because of this, when the system is suspended, the power MOSFET and the switching element for reducing a leakage current are both in an OFF state, and when the system is activated, the switching element for reducing a leakage current always is in an ON state. Although the power MOSFET usually is put in an ON state by the control circuit, it is turned off in the case where it is required to perform a protection function based on the voltage detection signal from the voltage detection circuit.

Furthermore, the power MOSFET and the switching element for reducing a leakage current are formed on the same semiconductor substrate. The configuration of the device is as follows: the power MOSFET is a vertical N-channel MOSFET formed on an N-type silicon substrate; the switching element for reducing a leakage current is a vertical N-channel MOSFET formed on the silicon substrate in which the same drain electrode as that of the power MOSFET is used; and a source electrode of the switching element is led out to the surface of the silicon substrate and connected to a resistive element for detecting a drain voltage formed on the same silicon substrate.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative embodiments with reference to the drawings.

Embodiment 1

Figure 1:
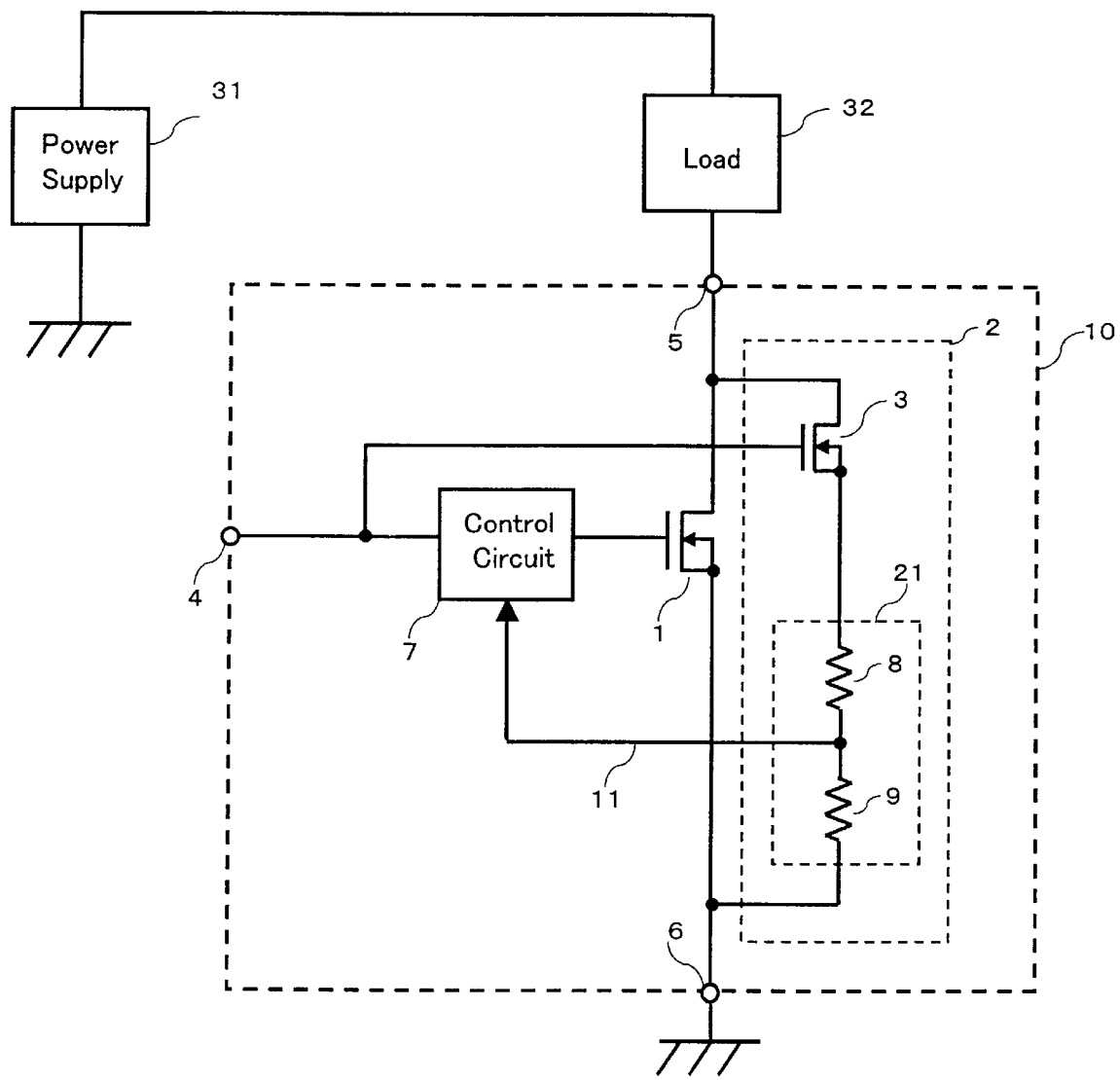
FIG. 1 is a circuit diagram showing an exemplary load driving circuit using a semiconductor device of Embodiment 1 according to the present invention.
Figure 7:
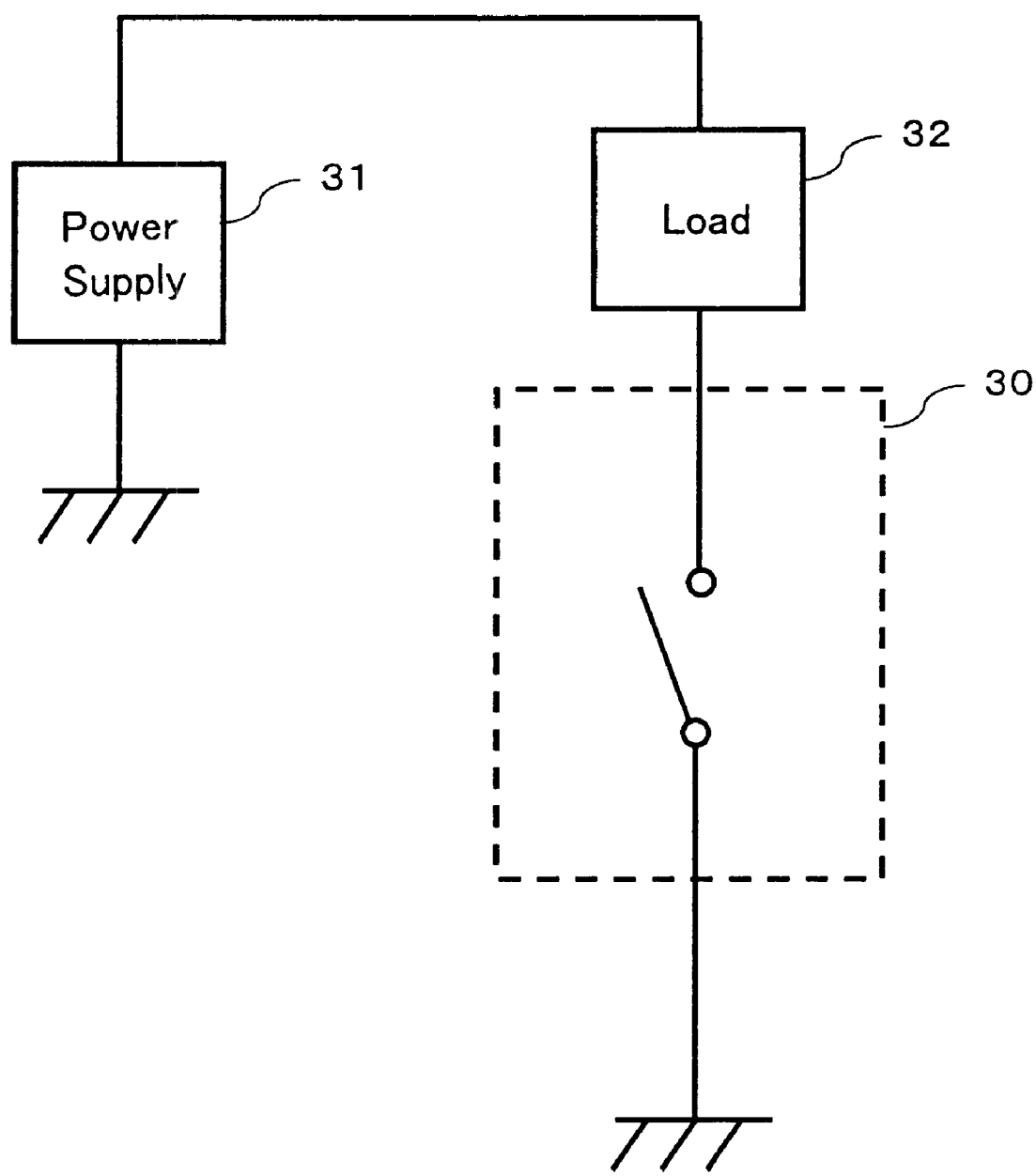
FIG. 7 is a schematic view of a load driving circuit using a conventional low potential switch.
Figure 8:
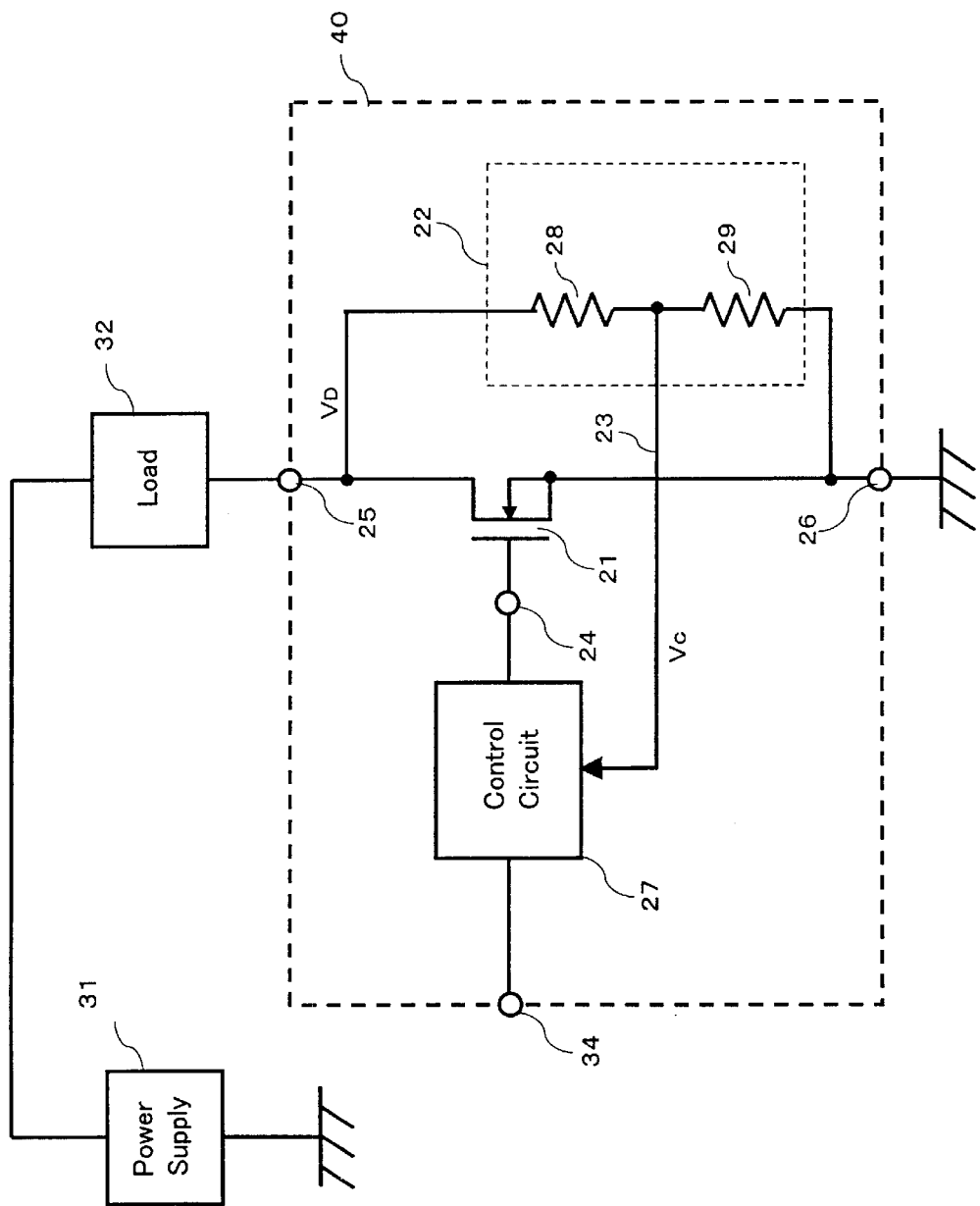
FIG. 8 is a view showing an exemplary load driving circuit using a conventional semiconductor device.

FIG. 1 is a circuit diagram showing an exemplary load driving circuit using a semiconductor device of Embodiment 1 according to the present invention. A semiconductor device 10 shown in FIG. 1 is configured as a device incorporating various protection functions in the low side switch 30 shown in FIG. 7. The system is used in a manner similar to that of the conventional example of FIG. 8.

In FIG. 1, the semiconductor device 10 is composed of an N-channel MOSFET 1 (first switching element) that is a power switching element for turning on/off a power supply to a load, a voltage detection circuit 2 connected in parallel to the N-channel MOSFET 1, for detecting a drain voltage of the N-channel MOSFET 1, and a control circuit 7 that receives a control signal supplied from outside to a control terminal 4 of the semiconductor device 10 and a voltage detection signal output from the voltage detection circuit 2, drives the N-channel MOSFET 1, and includes a load short protection function, an overcurrent protection function, and the like.

The voltage detection circuit 2 is composed of a switching element 3 (second switching element) for reducing a leakage current flowing from a drain terminal (electrode) 5 to a source terminal (electrode) 6 during an OFF time of the N-channel MOSFET 1, and a voltage detection portion 21 including resistive elements 8 and 9 connected in series, for outputting a drain voltage as a voltage detection signal by dividing a voltage upon a resistance ratio.

Herein, when the system is suspended; more specifically, when a logical "L" level signal is input to the control terminal 4, the logical "L" level signal is supplied from the control circuit 7 to a gate electrode of the Nchannel MOSFET 1. Consequently, the N-channel MOSFET 1 is turned off. Furthermore, a gate electrode of the switching element 3 for reducing a leakage current of the voltage detection circuit 2 directly is supplied with the logical "L" level signal applied to the control terminal 4, whereby the switching element 3 for reducing a leakage current also is turned off. Thus, a large leakage current does not flow during suspension of the system, and a leakage current can be suppressed to about 1 $\mu$A or less.

Furthermore, when the system is activated; more specifically, when a logical "H" level signal is input to the control terminal 4, the logical "H" level signal always is supplied to the gate electrode of the switching element 3 for reducing a leakage current, whereby the switching element 3 for reducing a leakage current is turned on. At this time, a voltage detection signal 11 obtained by dividing a drain voltage upon a resistance ratio by the resistive elements 8 and 9 of the voltage detection portion 21 is output to the control circuit 7 to be used for various protection functions. The N-channel MOSFET 1 may be in an ON/OFF state, depending upon an output signal of the control circuit 7.

Herein, as supplemental remarks, description will be made regarding whether the switching element 3 for reducing a leakage current is required to be connected to a high potential side of the voltage detection portion 21, i.e., a drain electrode side of the N-channel MOSFET 1.

Figure 4:
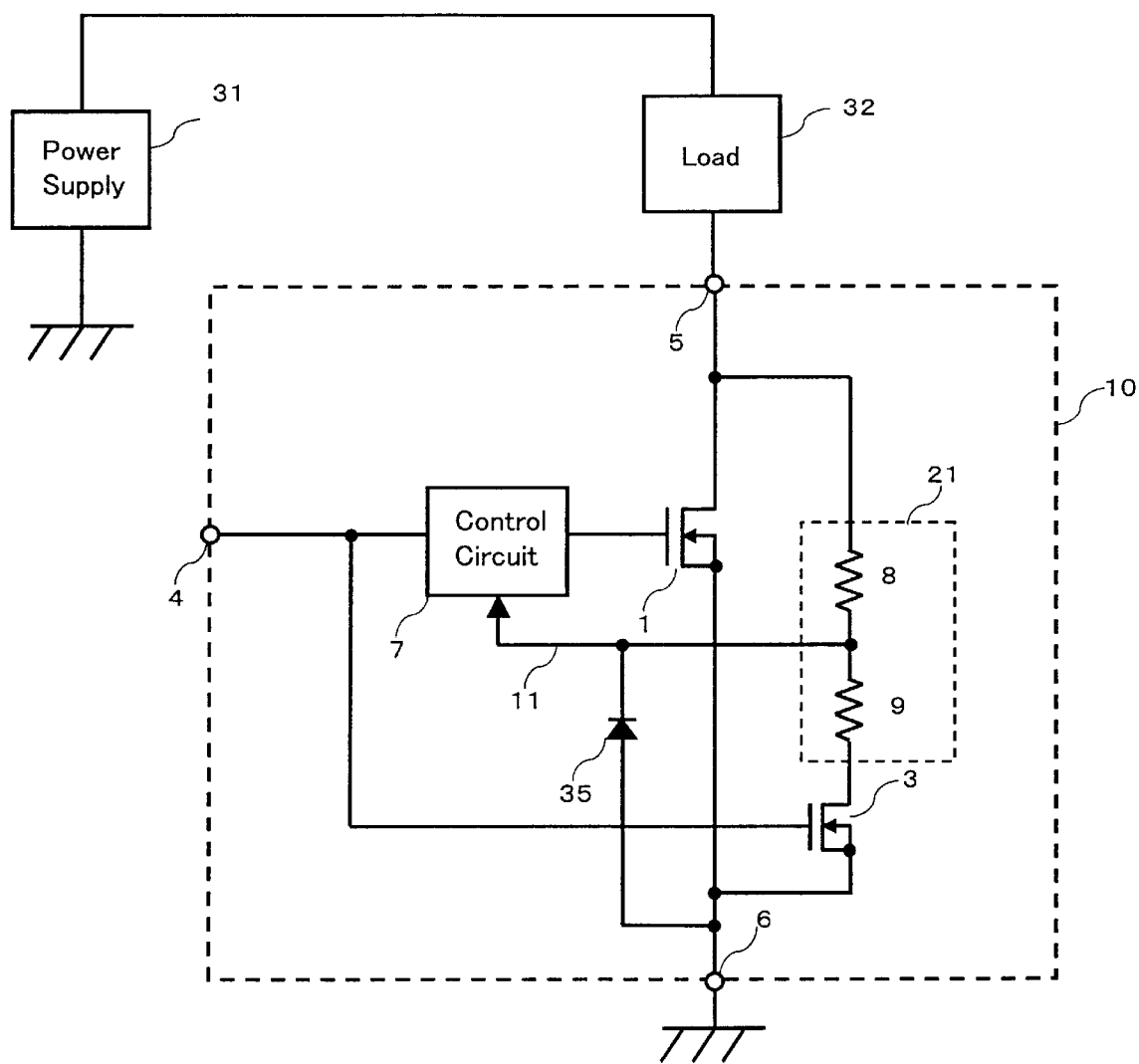
FIG. 4 is a circuit diagram for elaborating on the advantage of the semiconductor device of Embodiment 1 according to the present invention.

For example, as shown in FIG. 4, in the case where the switching element 3 for reducing a leakage current is connected between the voltage detection portion 21 and the source terminal 6, a drain voltage detection function is performed normally when the system is activated. On the other hand, when the system is suspended, the logical "L" level signal is input to the control terminal 4, and the switching element 3 for reducing a leakage current is turned off. Therefore, a large leakage current does not flow from the drain terminal 5 to the source terminal 6 through the resistive elements 8 and 9 in the voltage detection portion 21.

At this time, the potential of the voltage detection signal 11 output from a common connecting portion between the resistive elements 8 and 9 is increased substantially up to that of the drain terminal 5. Furthermore, usually, a gate of a MOSFET with a low withstand voltage of the control circuit 3 receives an output of the voltage detection circuit 2, and the output of the voltage detection circuit 2 and the gate of the MOSFET with a low withstand voltage generally are connected to each other. However, since the gate withstand voltage of the MOSFET with a low withstand voltage is low, it is required to connect, as a protective element, a Zener diode 35 having a withstand voltage lower than the gate withstand voltage of the MOSFET with a low withstand voltage. In this case, when the N-channel MOSFET 1 and the switching element 3 for reducing a leakage current are both in an OFF state, a leakage current flows through a path: drain terminal 5→resistive element 8→Zener diode 35→source terminal 6, from a time when the potential of the drain terminal 5 exceeds the withstand voltage of the Zener diode 35.

However, as shown in FIG. 1, if the switching element 3 for reducing a leakage current is connected between the voltage detection portion 21 and the drain terminal 5, unlike the configuration shown in FIG. 4, the voltage detection signal 11 of the voltage detection circuit 2 is not increased to a high potential when the system is suspended. Therefore, a Zener diode is not required as a protective element. Furthermore, even when a Zener diode is connected as a protective element, a leakage current does not flow when a drain voltage is increased.

In Embodiment 1, the case has been described in which an N-channel MOSFET is used as a power switching element. The power switching element also can be composed of an insulating gate type bipolar transistor (IGBT) or a normal bipolar transistor.

Embodiment 2

Figure 2:
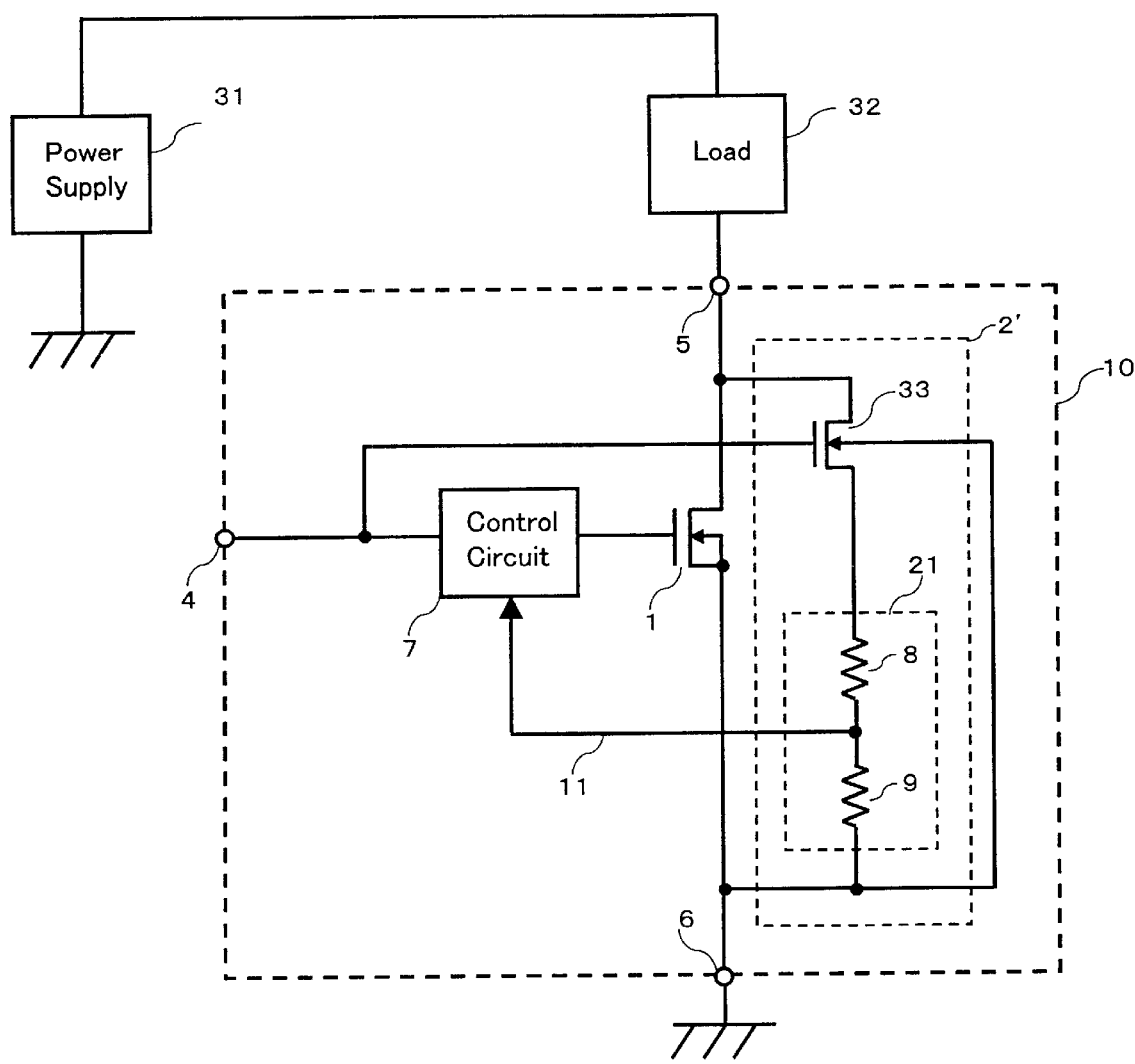
FIG. 2 is a circuit diagram showing an exemplary load driving circuit using a semiconductor device of Embodiment 2 according to the present invention.

FIG. 2 is a circuit diagram showing an exemplary load driving circuit using a semiconductor device of Embodiment 2 according to the present invention. In FIG. 2, the same components as those in FIG. 1 are denoted with the same reference numerals as those therein.

In Embodiment 1, the backgate of the switching element for reducing a leakage current is connected to a source electrode thereof. In Embodiment 2, the backgate of the switching element for reducing a leakage current is connected to the source terminal 6 so as to be decreased to a ground potential of the system.

In the case of the connection as shown in FIG. 2, the backgate potential of the switching element 33 for reducing a leakage current becomes a ground potential of the system so as not to be varied. Therefore, the system becomes strong with respect to resisting malfunction.

Embodiment 3

Figure 3:
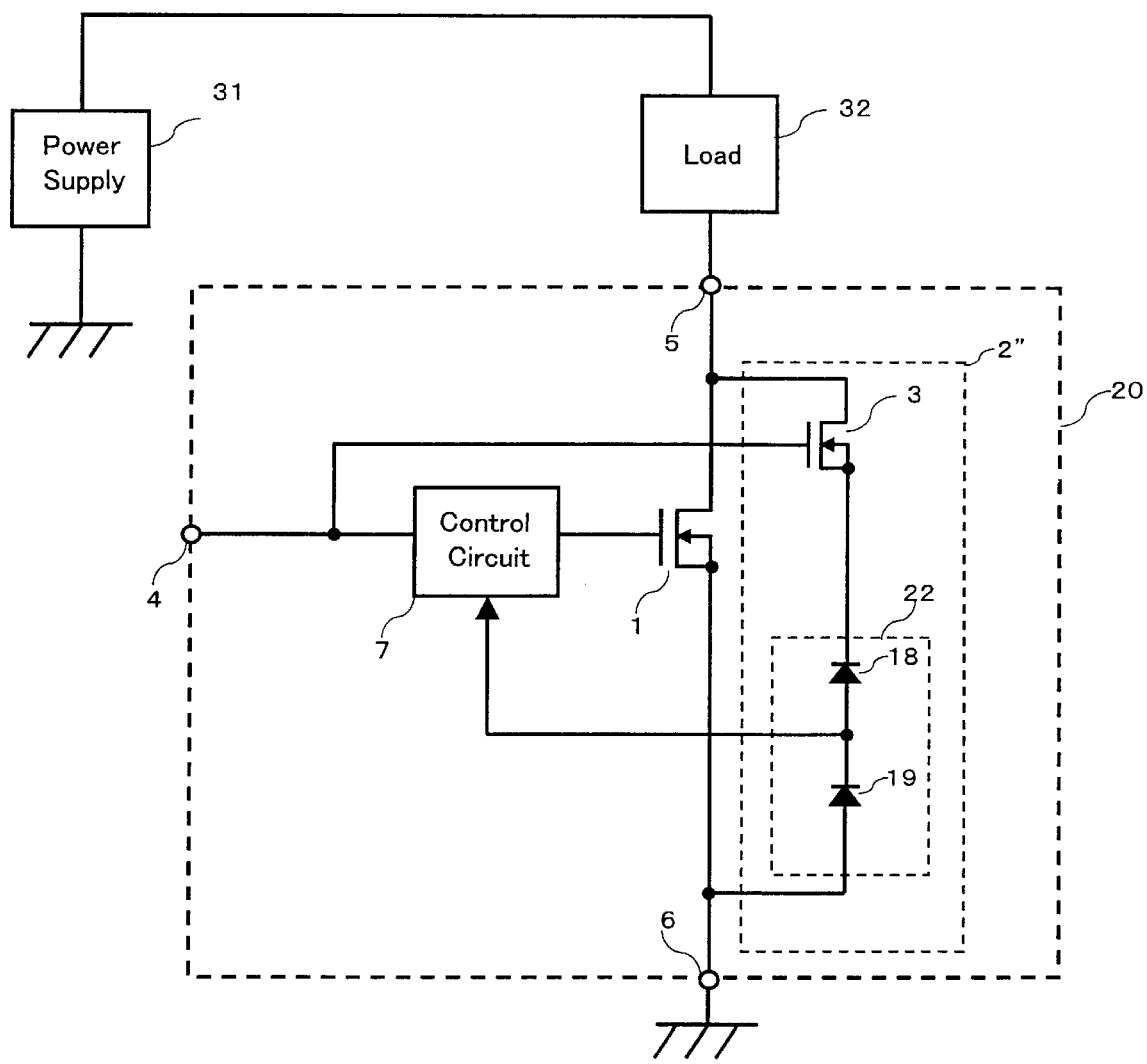
FIG. 3 is a circuit diagram showing an exemplary load driving circuit using a semiconductor device of Embodiment 3 according to the present invention.

FIG. 3 is a circuit diagram showing an exemplary load driving circuit using a semiconductor device of Embodiment 3 according to the present invention. In FIG. 3, the same components as those in FIG. 1 are denoted with the same reference numerals as those therein.

The difference between Embodiments 1 and 3 lies in the configuration of a voltage detection portion. In the present embodiment, a voltage is detected by division to a plurality of (two in FIG. 3) Zener diodes 18 and 19. According to this configuration, the precision of detection of a drain voltage can be ensured up to the precision of a Zener diode.

Embodiment 4

Figure 5:
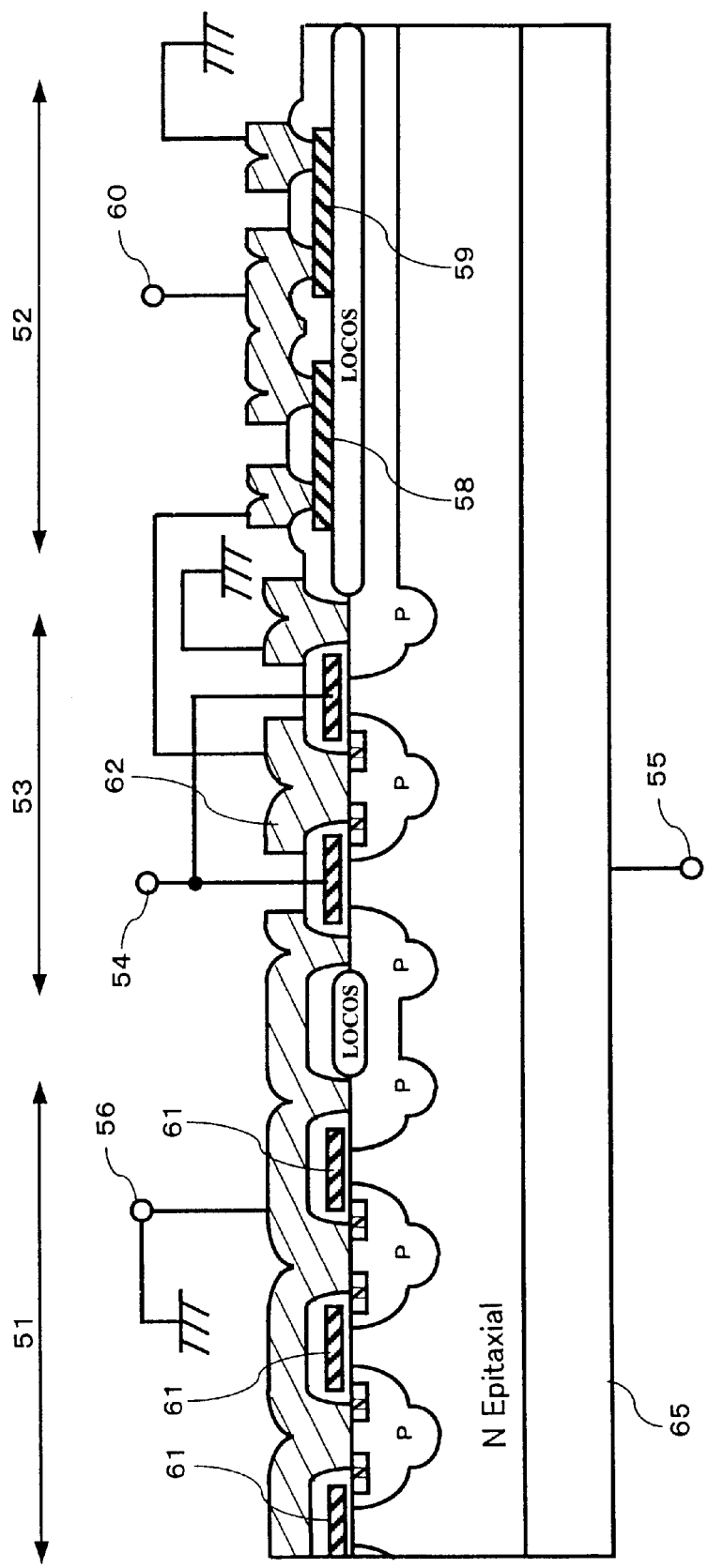
FIG. 5 is a cross-sectional view showing a configuration of a semiconductor device of Embodiment 4 according to the present invention.

FIG. 5 is a cross-sectional view showing a semiconductor structure of Embodiment 4 according to the present invention for achieving a circuit configuration of the semiconductor device of Embodiment 1 on a single semiconductor substrate.

In FIG. 5, reference numeral 51 denotes a power MOSFET, 52 denotes a voltage detection portion, and 53 denotes a MOSFET as a switching element for reducing a leakage current. A drain electrode of the power MOSFET 51 becomes a reverse surface electrode (drain terminal 55) of an N-type silicon substrate 65. Reference numeral 61 denotes a gate electrode of the power MOSFET 51. A source electrode 56 is led out to the surface and grounded. Furthermore, a drain electrode of the MOSFET 53 as the switching element for reducing a leakage current becomes a reverse surface electrode (drain terminal 55) of the N-type silicon substrate 65, in the same way as in the drain electrode of the power MOSFET 51. A gate electrode 54 is led out as shown in the figure, and connected to a control terminal for the system. Furthermore, a source electrode 62 of the MOSFET 53 is connected to a resistor 58 constituting the voltage detection portion. Furthermore, resistive elements 58 and 59 are connected to each other as shown in the figure, and the other terminal of the resistive element 59 is grounded.

Herein, it is desirable that the resistive elements 58 and 59 are made of polysilicon on a field oxide film. By using a polysilicon resistor, elements with a high withstand voltage and a high resistance can be formed relatively easily on the same semiconductor substrate as that of the power MOSFET 51.

A voltage detection signal that is an output signal of the voltage detection portion 52 is extracted from an electrode 60 for connecting the resistive elements 58 and 59 to each other, and is connected to the control circuit 3 shown in FIG. 1.

In FIG. 5, the gate electrode 61 of the power MOSFET 51 and the gate electrode 54 of the MOSFET 53 that is a switching element for reducing a leakage current are not connected directly to each other.

Embodiment 5

Figure 6:
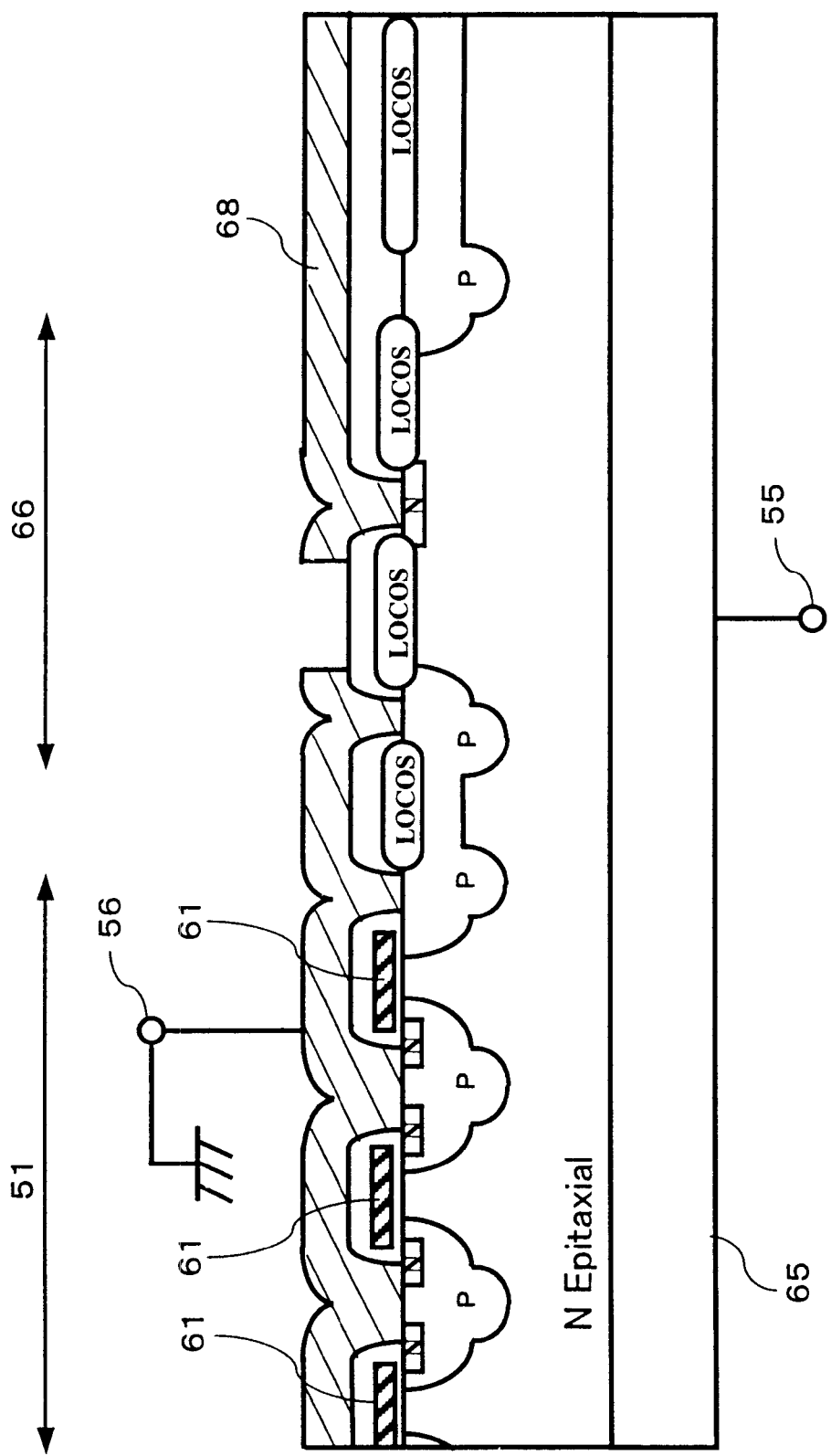
FIG. 6 is a cross-sectional view showing a configuration of a semiconductor device of Embodiment 5 according to the present invention.

A switching element for reducing a leakage current may be formed in a portion insulated with an insulator (e.g., oxide film) from a portion where a power switching element is formed. In the case where a vertical MOSFET as shown in FIG. 6 is used as a power switching element, it is required to extract a voltage of a drain electrode of the MOSFET to the surface of a semiconductor, and connect it to the switching element for reducing a leakage current. This procedure is shown in FIG. 6 as Embodiment 5 according to the present invention. In FIG. 6, the same components as those in FIG. 5 are denoted with the same reference numerals as those therein.

A drain electrode of the N-channel power MOSFET 51 is a reverse surface electrode (drain terminal 55) of a semiconductor substrate 65. In order to extract a drain voltage of the power MOSFET 51, a drain voltage extracting portion 66 is provided. The same voltage as the drain voltage of the power MOSFET 51 is output to the voltage detection electrode 68 that is an output electrode of the drain voltage extracting portion 66. When the power MOSFET 51 is in an OFF state, the periphery of the drain voltage extracting portion 66 is surrounded by a concentrated P-layer, and a P-layer is not formed in an underside region of LOCOS, whereby a withstand voltage becomes equal to or higher than that of the power MOSFET 51. Therefore, a current leak does not occur.

As described above, the voltage detection electrode 68 is connected to a switching element for reducing a leakage current formed on a thick oxide film. Furthermore, the switching element for reducing a leakage current may be formed in a region insulated with an oxide film.

As described above, according to the present invention, a low side switch incorporating various protection functions can be realized, in which a drain voltage is detected, while a leakage current during suspension of a system is reduced.

Furthermore, by forming a power switching element, a switching element for reducing a leakage current, and a voltage detection portion on the same semiconductor substrate, a tip area can be reduced.

Embodiment 6

Figure 9:
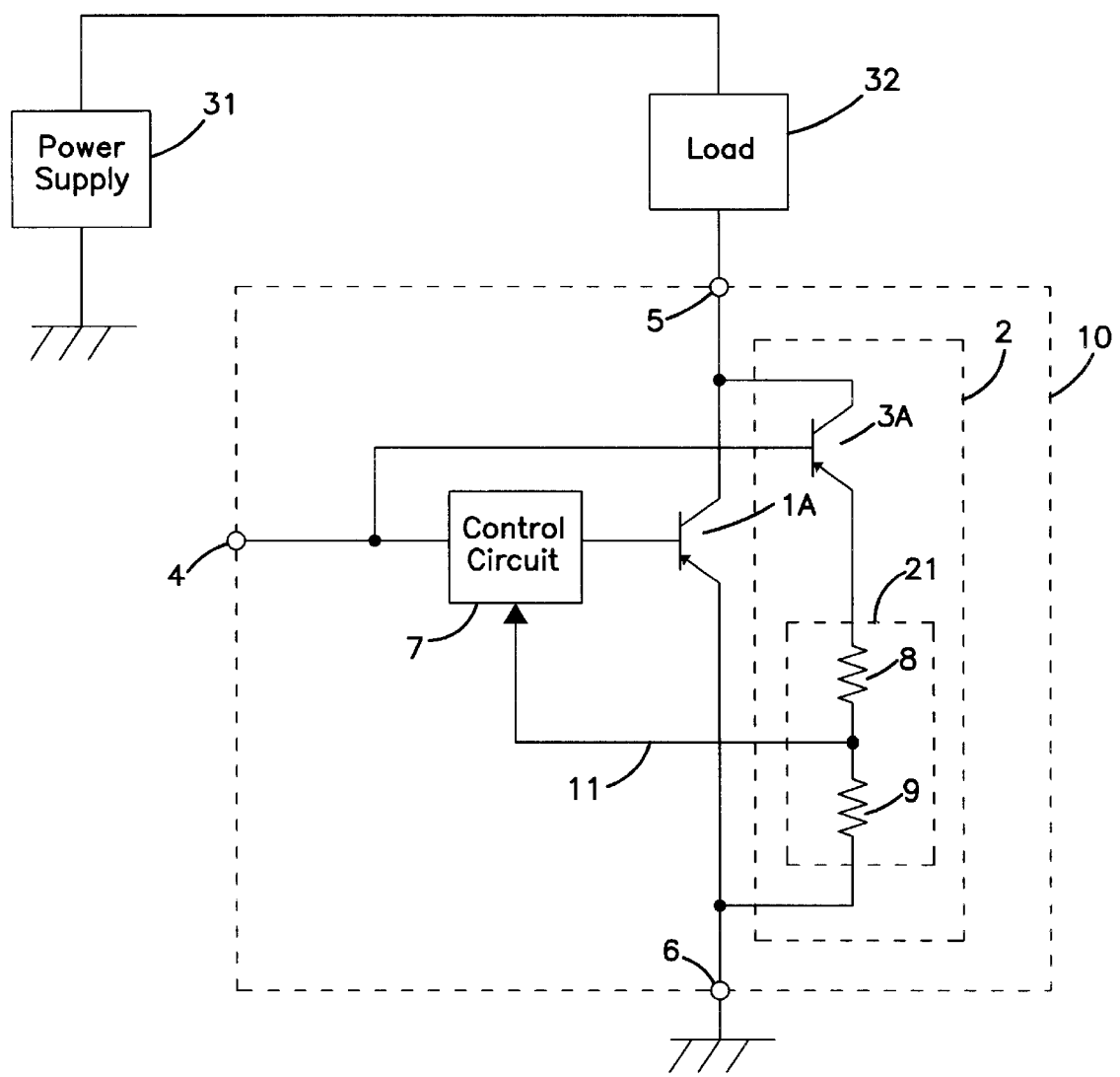
FIG. 9 is a circuit diagram showing an exemplary lead driving circuit using a semiconductor or device of embodiment 6, according to the present invention.

FIG. 9 is a circuit diagram showing an exemplary load driving circuit using a semiconductor device of Embodiment 6 according to the present invention. FIG. 9 is substantially the same as the circuit diagram shown in FIG. 1. However, FIG. 9 shows a semiconductor device 10 that is composed of bipolar transistor 1A (first switching element) as the power switching element for turning on/off a power supply to a load, instead of the MOSFET 1 shown in FIG. 1. Also, FIG. 9 shows a bipolar transistor (second switching element) 3A, whereas FIG. 1 shows a MOSFET 3.

In Embodiment 6, the case has been described in which a normal bipolar transistor is used as a power switching element. The power switching element also can be composed of an insulating gate type bipolar transistor (IGBT).

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A voltage detection circuit connected in parallel to a first switching element that is a low side switch for controlling a power supply to a load, comprising a second switching element and a voltage detection portion connected in series to each other, wherein the second switching element is connected to a high potential side of the first switching element, and the voltage detection portion comprises at least two resistive elements and detects a voltage of a high potential electrode of the first switching element based on a division ratio of resistance of the resistive elements.

2. A voltage detection circuit according to claim 1, wherein the resistive element is a polysilicon resistor formed on an oxide film of the same substrate as that of the first switching element.

3. A voltage detection circuit according to claim 1, wherein the second switching element is composed of an N-channel MOSFET.

4. A voltage detection circuit according to claim 3, wherein a backgate of the N-channel MOSFET is at the same potential as that of a source.

5. A voltage detection circuit according to claim 3, wherein a backgate of the N-channel MOSFET is at a ground potential.

6. A voltage detection circuit connected in parallel to a first switching element that is a low side switch for controlling a power supply to a load, comprising a second switching element and a voltage detection portion connected in series to each other, wherein the second switching element is connected to a high potential side of the first switching element, and the voltage detection portion comprises at least two Zener diodes and detects a voltage of a high potential electrode of the first switching element.

7. A voltage detection circuit according to claim 1, wherein the second switching element is an N-channel MOSFET with a withstand voltage higher than that of an element constituting a control circuit coupled to the gate of the first switching element.

8. A semiconductor device comprising:
 a first switching element for controlling a power supply to a load;
 a voltage detection circuit connected in parallel to the first switching element, including a second switching element and a voltage detection portion connected in series to each other, the second switching element being connected to a high potential side of the first switching element, the voltage detection portion detecting a voltage of a high potential electrode of the first switching element when the second switching element is conducting, wherein the voltage detection portion comprises at least two resistive elements, and detects a voltage of the high potential electrode of the first switching element based on a division ratio of resistance of the resistive elements; and
 a control circuit that brings the first switching element into conduction or out of conduction in accordance with a control signal from outside, and brings the first switching element out of conduction based on a voltage detection signal output from the voltage detection circuit.

9. A semiconductor device according to claim 8, wherein the second switching element of the voltage detection circuit is brought into conduction or out of conduction in accordance with the control signal from outside.

10. A semiconductor device according to claim 8, wherein the first switching element is composed of an N-channel MOSFET.

11. A semiconductor device according to claim 8, wherein the first switching element, the second switching element, and the voltage detection circuit are formed on the same semiconductor substrate.

12. A semiconductor device according to claim 8, wherein the first switching element is composed of an N-channel vertical MOSFET with a withstand voltage higher than that of an element constituting the control circuit, using an N-type silicon substrate as a drain electrode.

13. A semiconductor device according to claim 8, wherein the first switching element and the second switching element of the voltage detection circuit are both composed of an N-channel vertical MOSFET with a withstand voltage higher than that of an element constituting the control circuit, using the same N-type silicon substrate as a drain electrode.

14. A semiconductor device according to claim 8, wherein the second switching element of the voltage detection circuit is formed on the same semiconductor substrate as that of the first switching element under a condition of being electrically insulated with an insulator from the first switching element.

* * * * *